US011474785B2

(12) United States Patent
Kim

(10) Patent No.: US 11,474,785 B2
(45) Date of Patent: Oct. 18, 2022

(54) MEMORY DEVICE AND COMPUTING DEVICE USING THE SAME

(71) Applicant: SAMSUNG ELECTRONICS CO., LTD., Suwon-si (KR)

(72) Inventor: Ga Ram Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 16/943,334

(22) Filed: Jul. 30, 2020

(65) Prior Publication Data

US 2020/0356308 A1 Nov. 12, 2020

Related U.S. Application Data

(63) Continuation-in-part of application No. 16/578,507, filed on Sep. 23, 2019, now Pat. No. 11,307,826.

(30) Foreign Application Priority Data

Feb. 8, 2019 (KR) ........................ 10-2019-0014683

(51) Int. Cl.
*G06F 7/53* (2006.01)
*G06F 7/544* (2006.01)
*G06N 3/063* (2006.01)

(52) U.S. Cl.
CPC ............... *G06F 7/53* (2013.01); *G06N 3/063* (2013.01); *G06F 7/5443* (2013.01)

(58) Field of Classification Search
CPC . G06N 3/04; G06N 3/063; G06N 3/08; G06F 7/5443; G06F 7/53; G06F 17/16;
(Continued)

(56) References Cited

U.S. PATENT DOCUMENTS 3,670,956 A * 6/1972 Calhoun ............... G06F 7/5324
708/626
6,202,113 B1 3/2001 Oikawa
(Continued)

FOREIGN PATENT DOCUMENTS

| JP | 11-143786 | 5/1999 |
|----|-----------|--------|
| JP | 2002-269067 | 9/2002 |
| KR | 10-2018-0089701 | 8/2018 |

OTHER PUBLICATIONS

Dhole, Samiksha. "Design and FPGA Implementation of 4×4 Vedic Multiplier . . . " Www.ijert.org, Apr. 2017, https://www.ijert.org/research/design-and-fpga-implementation-of-4x4-vedic-multiplier-using-different-architectures-IJERTV6IS040673.pdf. (Year: 2017).*

(Continued)

*Primary Examiner* — Matthew D Sandifer
*Assistant Examiner* — Huy Duong
(74) *Attorney, Agent, or Firm* — F. Chau & Associates, LLC

(57) ABSTRACT

A memory device is provided. The memory device includes: a cell region including a first metal pad, a memory cell in the cell region configured to store weight data, a peripheral region including a second metal pad and vertically connected to the memory cell by the first metal pad and the second metal pad, a buffer memory in the peripheral region configured to read the weight data from the memory cell, an input/output pad in the peripheral region configured to receive input data; and a multiply-accumulate (MAC) operator in the peripheral region configured to receive the weight data from the buffer memory and receive the input data from the input/output pad to perform a convolution operation of the weight data and the input data, wherein the input data is provided to the MAC operator during a first period, and wherein the MAC operator performs the convolution opera-
(Continued)

tion of the weight data and the input data during a second period overlapping with the first period.

20 Claims, 15 Drawing Sheets

(58) Field of Classification Search
CPC ...... G06F 7/5318; G06F 7/533; G06F 7/5324; G06F 17/15; G06G 7/16
See application file for complete search history.

(56) References Cited

U.S. PATENT DOCUMENTS

| | | |
|---|---|---|
| 7,155,581 B2 | 12/2006 | Elliott et al. |
| 7,716,269 B2 | 5/2010 | Simon et al. |
| 9,582,465 B2 | 2/2017 | Hyde et al. |
| 2003/0222879 A1 | 12/2003 | Lin et al. |
| 2005/0027773 A1 | 2/2005 | Simon et al. |
| 2011/0239032 A1 | 9/2011 | Kato et al. |
| 2016/0086967 A1* | 3/2016 | Lee ...................... H01L 23/528 365/185.18 |
| 2017/0220526 A1 | 8/2017 | Buchanan |
| 2017/0278559 A1 | 9/2017 | Hush |
| 2018/0144813 A1 | 5/2018 | Hong et al. |
| 2019/0043868 A1* | 2/2019 | Hasnat .............. H01L 27/11556 |
| 2020/0058669 A1* | 2/2020 | Chen ................... H01L 27/1157 |

OTHER PUBLICATIONS

Yangtze Memory Technologies Co., Ltd (YMTC). "Yangtze Memory Technologies Introduces New 3D NAND Architecture—XTACKING™." Aug. 6, 2018, https://www.prnewswire.com/news-releases/yangtze-memory-technologies-introduces-new-3d- (Year: 2018).*

Jie, et al., "A 2×2 bit Vedic multiplier with different adders in 90nm CMOS Technology", AIP Publishing, AIP Publishing LLC AIP Publishing, Sep. 14, 2017,. aip.scitation.org/doi/abs/10.1063/1.5002035. (Year: 2017).

Office Action dated May 26, 2021 in corresponding U.S. Appl. No. 16/578,507.

* cited by examiner

MEMORY DEVICE AND COMPUTING DEVICE USING THE SAME

CROSS-REFERENCE TO RELATED APPLICATION

This application is a Continuation-in-Part application of, and claims priority to, U.S. patent application Ser. No. 16/578,507, which was filed on Sep. 23, 2019 and claimed priority from Korean Patent Application No. 10-2019-0014683 filed on Feb. 8, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a memory device and a computing device using the same.

2. Description of the Related Art

A basic algorithm of a neural network is to derive an output matrix through an operation of an input matrix and a convolution filter. Specifically, the output matrix can be determined through a convolution operation of the input matrix and the convolution filter.

A convolution operation includes a combination of multiplication and summation operations. With the recent explosive growth of the neural network, a high-band and low-delay neural network engine is required. Accordingly, the size of the convolution filter increases, and the amount of weight data included in the convolution filter is increasing exponentially. Similarly, the amount of input data included in the input matrix also increases exponentially, thereby requiring a very large amount of multiplication and summation operations to be performed to produce an output matrix.

It takes a long time to satisfy the increased requirements in the current system, which reduces its utilization. Therefore, it is necessary to develop a neural network engine which maintains a high band but satisfies a low delay.

SUMMARY

Aspects of the present disclosure provide a memory device which performs a convolution operation in the memory device and performs a simple and effective operation, and a computing device using the same.

Aspects of the present disclosure also provide a memory device which performs a convolution operation in the memory device and satisfies a low delay, and a computing device using the same.

Aspects of the present disclosure also provide a memory device including a MAC operator in which input data and output data are inputted and outputted simultaneously, and a computing device using the same.

According to an embodiment of the present disclosure, there is provided a memory device comprising: a cell region including a first metal pad, a memory cell in the cell region configured to store weight data, a peripheral region including a second metal pad and vertically connected to the memory cell by the first metal pad and the second metal pad, a buffer memory in the peripheral region configured to read the weight data from the memory cell, an input/output pad in the peripheral region configured to receive input data; and a multiply-accumulate (MAC) operator in the peripheral region configured to receive the weight data from the buffer memory and receive the input data from the input/output pad to perform a convolution operation of the weight data and the input data, wherein the input data is provided to the MAC operator during a first period, and wherein the MAC operator performs the convolution operation of the weight data and the input data during a second period overlapping with the first period. According to the aforementioned and other embodiment of the present disclosure, there is provided memory device comprising: a cell region including a first metal pad, a peripheral region including a second metal pad and vertically connected to the memory cell by the first metal pad and the second metal pad, a buffer memory in the peripheral region configured to store weight data including first and second weight bits, an input/output pad in the peripheral region configured to receive input data including first and second input bits; and a MAC operator in the peripheral region including first to third accumulators and configured to receive the weight data and the input data and perform a convolution operation of the weight data and the input data, wherein performing the convolution operation of the weight data and the input data by the MAC operator comprises, calculating a first product of the first weight bit and the first input bit and providing the first product to the first accumulator, calculating a second product of the second weight bit and the first input bit and providing the second product to the second accumulator, calculating a third product of the first weight bit and the second input bit and providing the third product to the second accumulator, and calculating a fourth product of the second weight bit and the second input bit and providing the fourth product to the third accumulator.

According to the aforementioned and other embodiment of the present disclosure, there is provided memory device comprising: a cell region including a first metal pad; a memory cell in the cell region configured to store weight data; a peripheral region including a second metal pad and vertically connected to the memory cell by the first metal pad and the second metal pad; a buffer memory in the peripheral region configured to read the weight data from the memory cell; an input/output pad in the peripheral region configured to receive input data; and a MAC operator in the peripheral region configured to perform a convolution operation of the weight data and the input data, wherein the buffer memory reads the weight data from the memory cell before the input data is provided to the input/output pad, wherein the input data is provided to the MAC operator from the input/output pad during a first period, and wherein the weight data is provided to the MAC operator from the buffer memory during a second period overlapping with the first period.

According to the aforementioned and other embodiment of the present disclosure, there is provided computing device comprising: a memory device including a cell region including a first metal pad, a peripheral region including a second metal pad and vertically connected to the memory cell by the first metal pad and the second metal pad, a MAC operator in the peripheral region and configured to store weight data and a processor configured to provide input data to the memory device, wherein the MAC operator receives the input data and the weight data and performs a convolution operation of the input data and the weight data, and wherein a first period, in which the input data is provided to the MAC operator, and a second period, in which the weight data is provided to the MAC operator, overlap each other.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
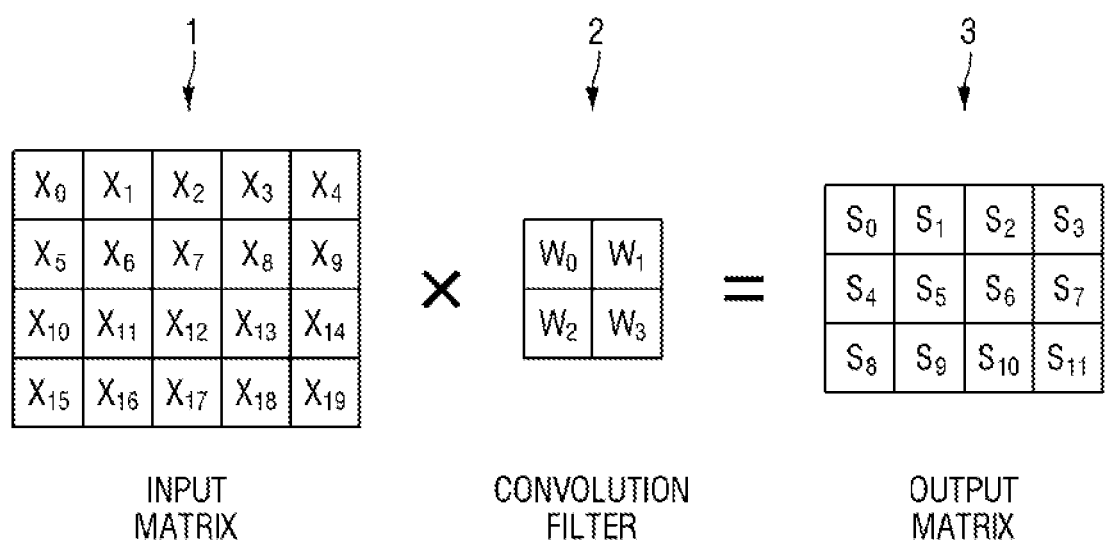
FIG. 1 is an exemplary diagram explaining a convolution operation.

FIG. 1 is an exemplary diagram explaining a convolution operation.

Referring to FIG. 1, an output matrix 3 may be generated by performing a convolution operation on an input matrix 1 and a convolution filter (or kernel) 2. For example, the input matrix 1 may include first input data $X_0$ to twentieth input data $X_{19}$. Further, for example, the convolution filter 2 may include first weight data $W_0$ to fourth weight data $W_3$. Further, for example, the output matrix 3 may include first output data $S_0$ to twelfth output data $S_{11}$. Some embodiments of the present disclosure are not limited to those terms, and the following description will be clearly understood by those skilled in the art. For simplicity of description, although FIG. 1 illustrates a case where the input matrix 1 is a 4×5 matrix, the convolution filter 2 is a 2×2 matrix and the output matrix 3 is a 3×4 matrix, this is merely exemplary and embodiments are not limited thereto. The input matrix 1 and the convolution filter 2 may include more or less data and the output matrix 3 may be determined according to the configuration of the input matrix 1 and the convolution filter 2.

The output matrix 3 may be determined by multiplication and summation operations of input data I_Data and weight data W_Data. That is, the convolution operation may be a combination of multiplication and summation operations. For example, the first output data $S_0$ and the second output data $S_1$ may be determined through the following Eq. 1 and Eq. 2:

$$S_0 = X_0 W_0 + X_1 W_1 + X_5 W_2 + X_6 W_3 \qquad \text{Eq. 1}$$

$$S_1 = X_1 W_0 + X_2 W_1 + X_6 W_2 + X_7 W_3 \qquad \text{Eq. 2}$$

As represented in Eq. 1, the first output data $S_0$ may be determined by summing a product of the first input data $X_0$ and the first weight data $W_0$, a product of the second input data $X_1$ and the second weight data $W_1$, a product of the sixth input data $X_5$ and the third weight data $W_2$ and a product of the seventh input data $X_6$ and the fourth weight data $W_3$. In the same way, as represented in Eq. 2, the second output data $S_1$ may be determined by summing a product of the second input data $X_1$ and the first weight data $W_0$, a product of the third input data $X_3$ and the second weight data $W_1$, a product of the seventh input data $X_6$ and the third weight data $W_2$ and a product of the eighth input data $X_7$ and the fourth weight data $W_3$. In the same way, Similarly, the third output data $S_2$ to the twelfth output data $S_{11}$ may be determined by performing multiplication and summation operations performance on the first input data $X_0$ to the twentieth input data $X_{19}$ and the first weight data $W_0$ to the fourth weight data $W_3$. Hereinafter, a computing device 1000 which generates the output matrix 3, i.e., the computing device 1000 which performs the convolution operation of the input data I_Data and the weight data W_Data, will be described.

Figure 2:
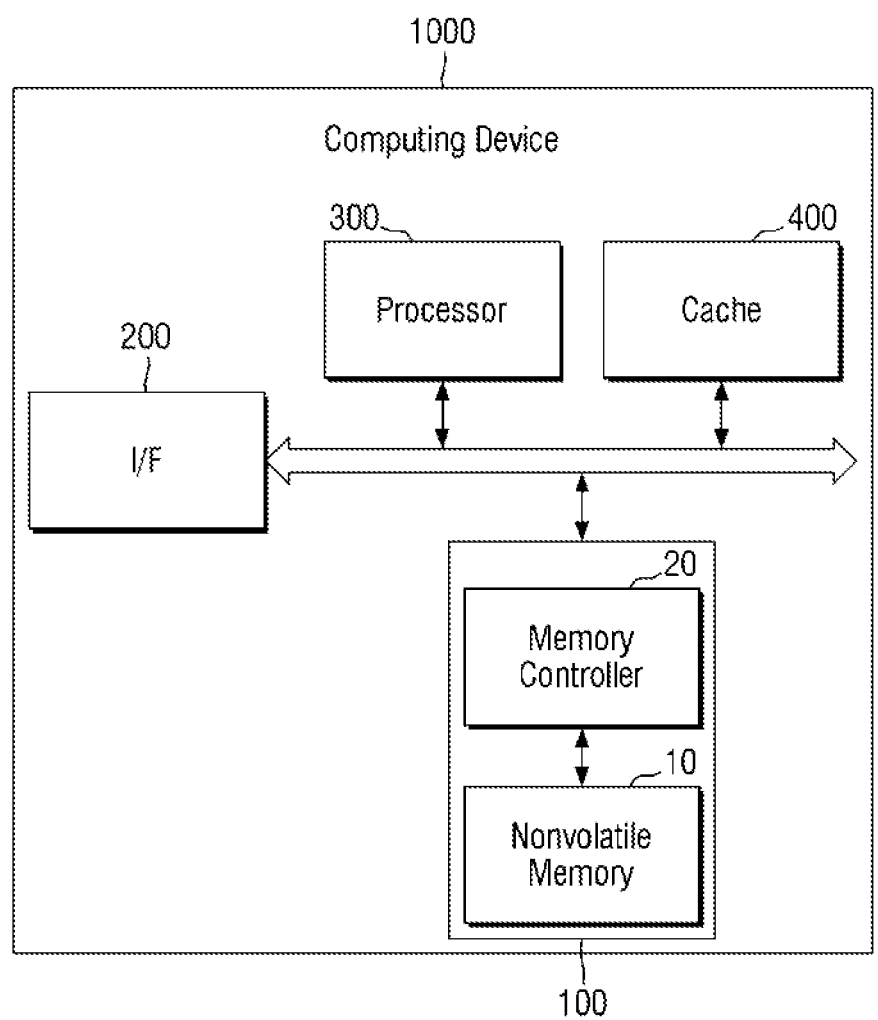
FIG. 2 is an exemplary block diagram illustrating a computing device according to some embodiments.

FIG. 2 is an exemplary block diagram illustrating a computing device according to some embodiments.

Referring to FIG. 2, the computing device 1000 according to some embodiments may include an interface 200, a processor 300, a cache memory 400 and a memory device 100.

The computing device 1000 according to some embodiments may include a personal computer such as a desktop computer, a server computer, a portable computer such as a laptop computer, and a portable device such as a cellular phone, a smart phone, a tablet, a MP3, a portable multimedia player (PMP), a personal digital assistant (PDA), a digital camera and a digital camcorder. Further, the computing device 1000 according to some embodiments may be a processing device based on a neural network. For example, the computing device 1000 according to some embodiments may be used in an image processing apparatus based on a convolution neural network (CNN), an automatic steering apparatus, a driving assistance apparatus or the like. In addition, the computing device 1000 according to some embodiments may be used to perform digital signal processing (DSP). However, the technical concept of the present disclosure is not limited thereto, and the computing device 1000 according to some embodiments of the present disclosure may be used in various fields by those skilled in the art as needed.

The interface 200 may be used to input/output data to/from the computing device 1000. For example, the first input data $X_0$ to the twentieth input data $X_{19}$ described with reference to FIG. 1 may be provided to the computing device 1000 through the interface 200, but the embodiments are limited thereto. For example, the first input data $X_0$ to the twentieth input data $X_{19}$ may be generated by a specific component included in the computing device 1000.

The processor 300 may execute program code for controlling the computing device 1000. The processor 300 according to some embodiments may include a central processing unit (CPU), a graphic processing unit (GPU), an application processor (AP), and a micro processor unit (MPU) and the like, but the embodiment are not limited thereto.

The cache memory 400 may be a memory capable of temporarily storing data in preparation for future requests so as to access data at a high speed. The data stored in the cache memory 400 may be the result of a previously performed operation. The cache memory 400 may be implemented as a static random access memory (SRAM), a fast static RAM (SRAM), and/or a dynamic RAM (DRAM), but the embodiment are not limited thereto. Although FIG. 1 illustrates that the cache memory 400 is separated from the processor 300, the embodiments are not limited thereto. For example, the cache memory 400 may be a tightly coupled memory (TCM) in the processor 300.

The memory device 100 may include a nonvolatile memory 10 and a memory controller 20. The memory controller 20 may read or erase data stored in the nonvolatile memory 10 or write data to the nonvolatile memory 10 in response to a request from the processor 300. Further, according to some embodiments, the memory controller 20 may receive a MAC command (MAC CMD) and control the nonvolatile memory 10 to perform a convolution operation.

The nonvolatile memory 10 may temporarily store data. For example, the nonvolatile memory 10 may store the first weight data $W_0$ to the fourth weight data $W_3$. The nonvolatile memory 10 according to some embodiments may perform a convolution operation in response to a request from the memory controller 20.

The nonvolatile memory 10 may be a single level cell (SLC) or a multi level cell (MLC) of a flash memory, but the embodiments are not limited thereto. For example, the nonvolatile memory 10 may include a PC card (personal computer memory card international association (PCM-CIA)), a compact flash card (CF), a smart media card (SM, SMC), a memory stick, a multimedia card (MMC, RS-MMC, MMCmicro), an SD card (SD, mini-SD, micro-SD, SDHC), a universal flash storage (UFS), an embedded multimedia card (eMMC), a NAND flash memory, a NOR flash memory and a vertical NAND flash memory.

Although not shown in the drawing, the memory controller 20 and/or the nonvolatile memory 10 may be mounted using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP) and the like, but the embodiments are not limited thereto. A detailed description of the nonvolatile memory 10 will be given with reference to FIG. 3.

Figure 3:
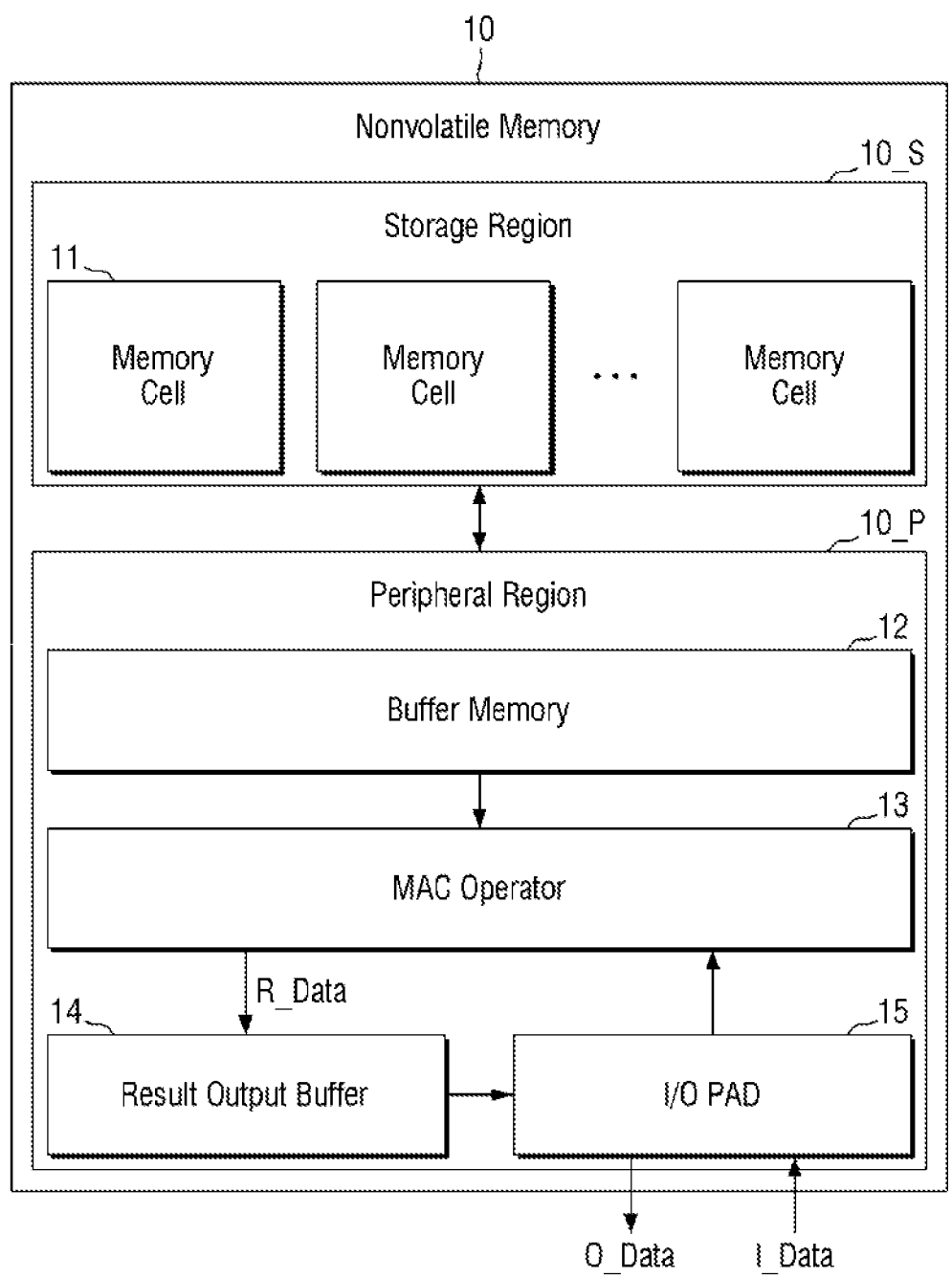
FIG. 3 is an exemplary block diagram illustrating a nonvolatile memory according to some embodiments.

FIG. 3 is an exemplary block diagram illustrating a nonvolatile memory according to some embodiments.

Referring to FIG. 3, the nonvolatile memory 10 may include a storage region 10_S and a peripheral region 10_P.

According to some embodiments, a plurality of memory cells 11 may be disposed in the storage region 10_S. Each of the memory cells 11 may store data. For example, the memory cell 11 may store the first weight data $W_0$ to the fourth weight data $W_3$. For simplicity of description, a region other than the storage region 10_S in which the memory cells 11 are disposed is defined as the peripheral region 10_P.

According to some embodiments, a buffer memory 12, a multiply-accumulate (MAC) operator 13, a result output buffer 14 and an input/output (I/O) pad 15 may be disposed in the peripheral region 10_P of the nonvolatile memory 10.

The buffer memory 12 and the I/O pad 15 may provide data to the MAC operator 13, respectively. For example, the buffer memory 12 may provide the weight data W_Data to the MAC operator 13 and the I/O pad 15 may provide the input data I_Data to the MAC operator 13.

The MAC operator 13 may perform a convolution operation on the received weight data W_Data and input data I_Data. The MAC operator 13 may the result output buffer 14 with a result of the convolution operation of the weight data W_Data and the input data I_Data. For simplicity of description, data provided to the result output buffer 14 is defined as result data R_Data. In some embodiments, the result data R_Data may be intermediate result data of the convolution operation of the weight data W_Data and the input data I_Data. For example, the result data R_Data may be each of the first output data $S_0$ to the twelfth output data $S_{11}$. As another example, the result data R_Data may be each of a product $W_0X_0$ of the first weight data $W_0$ and the first input data $X_0$ to a product $W_3X_{19}$ of the fourth weight data $W_3$ and the twentieth input data $X_{19}$. However, the embodiments are not limited thereto, and an intermediate result of the convolution operation of the weight data W_Data and the input data I_Data may be set to the result data R_Data by those skilled in the art.

The result output buffer 14 may store the result data R_Data. For example, each of the first output data $S_0$ to the twelfth output data $S_{11}$ may be temporarily stored in the result output buffer 14. When the first output data $S_0$ to the twelfth output data $S_{11}$ are all stored in the result output buffer 14, the result output buffer 14 may provide the first output data $S_0$ to the twelfth output data $S_{11}$ to the I/O pad 15.

The I/O pad 15 may receive the input data I_Data outside the nonvolatile memory 10. The I/O pad 15 may provide the received input data I_Data to the MAC operator 13. Further, the I/O pad 15 may receive the data stored in the result output buffer 14 and provide it to the outside of the nonvolatile memory 10 as the output data O_Data. In some embodiments, the output data O_Data may be intermediate result or final result data for the convolution operation of the weight data W_Data and the input data I_Data. For example, the output data O_Data may be the first output data $S_0$ to the twelfth output data $S_{11}$. As another example, the output data O_Data may be each of a product $W_0X_0$ of the first weight data $W_0$ and the first input data $X_0$ to a product $W_3X_{19}$ of the fourth weight data $W_3$ and the twentieth input data $X_{19}$.

Figure 4:
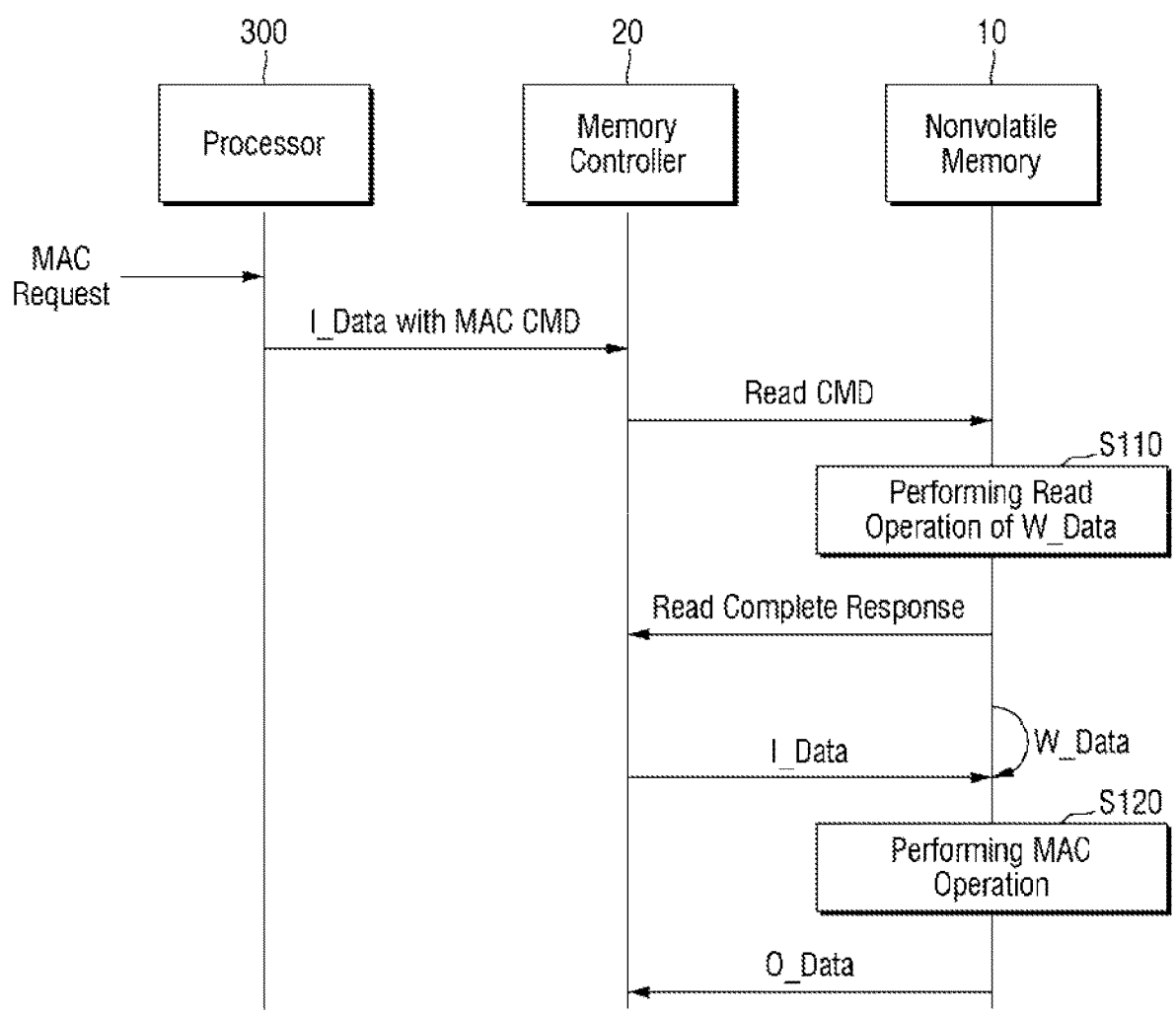
FIG. 4 is an exemplary diagram illustrating an operation of a computing device according to some embodiments.

FIG. 4 is an exemplary diagram illustrating an operation of a computing device according to some embodiments.

Referring to FIG. 4, the processor 300 receives a request for a MAC operation. The processor 300 may provide the MAC command (MAC CMD) together with the input data I_Data to the memory controller 20.

The memory controller 20 may provide a read command (Read CMD) for the weight data W_Data to the nonvolatile memory 10 in response to the received MAC command (MAC CMD). The nonvolatile memory 10 may read the weight data W_Data stored in the storage region 10_S of the nonvolatile memory 10 (for example, stored in the memory cell 11) in response to the read command (Read CMD) for the weight data W_Data (S110). The read weight data W_Data may be provided to the buffer memory 12. An exemplary description will be given with reference to FIGS. 5 to 7.

Figure 5:
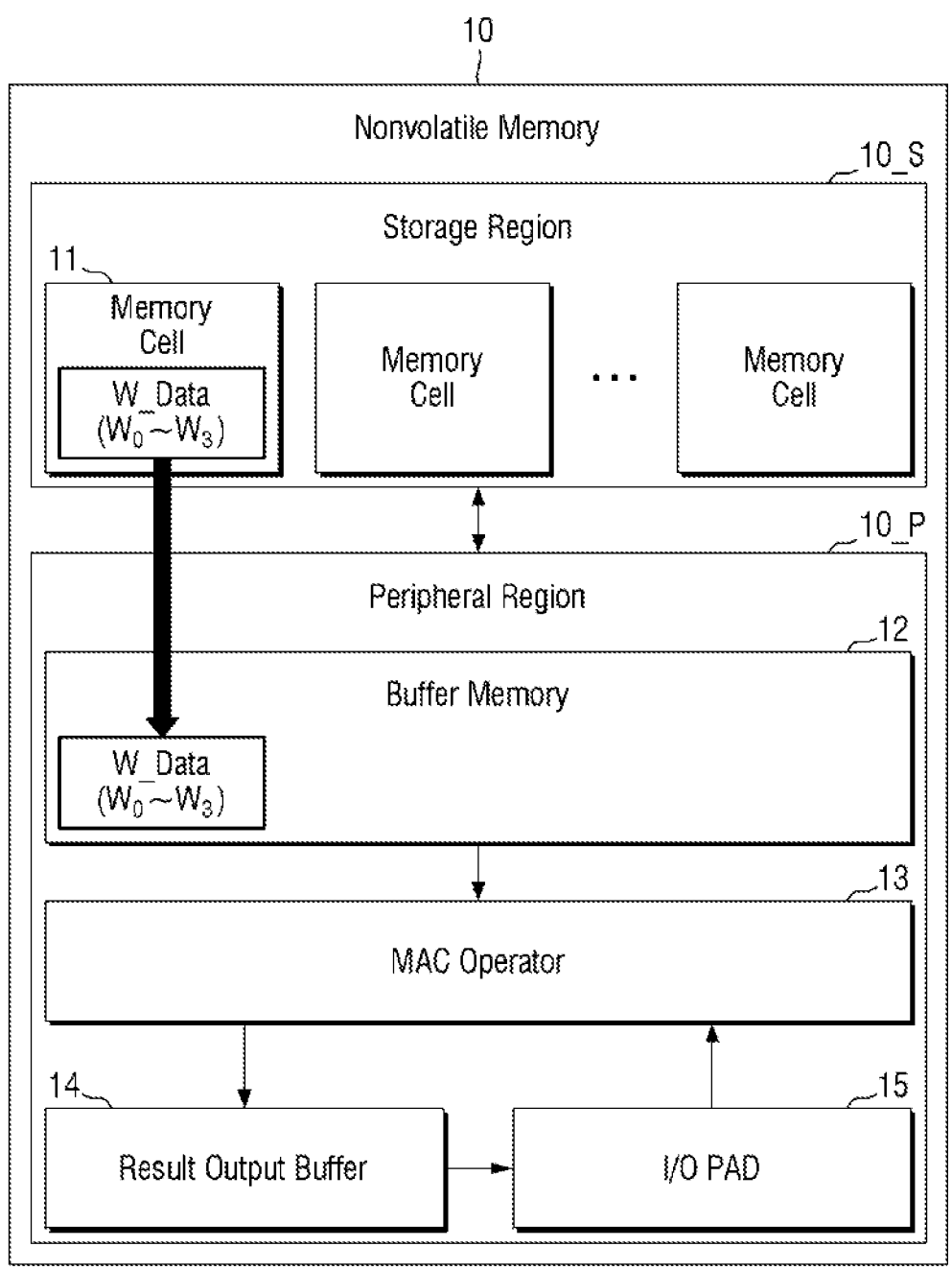
FIG. 5 is an exemplary diagram illustrating an operation in which weight data is provided to a buffer memory from a memory cell according to some embodiments.
Figure 6:
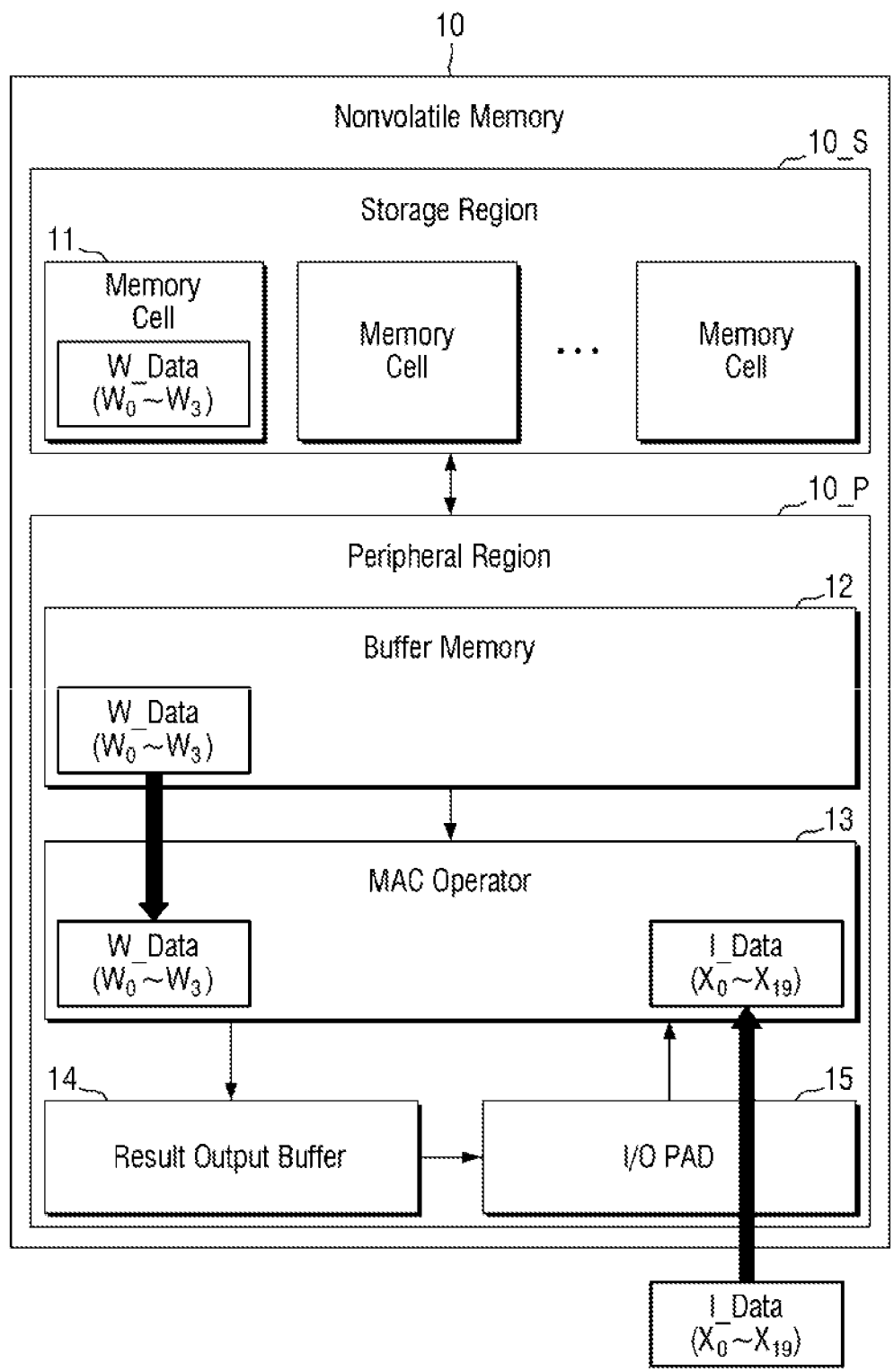
FIG. 6 is an exemplary diagram explaining an operation in which input data and weight data are provided to a MAC operator according to some embodiments.
Figure 7:
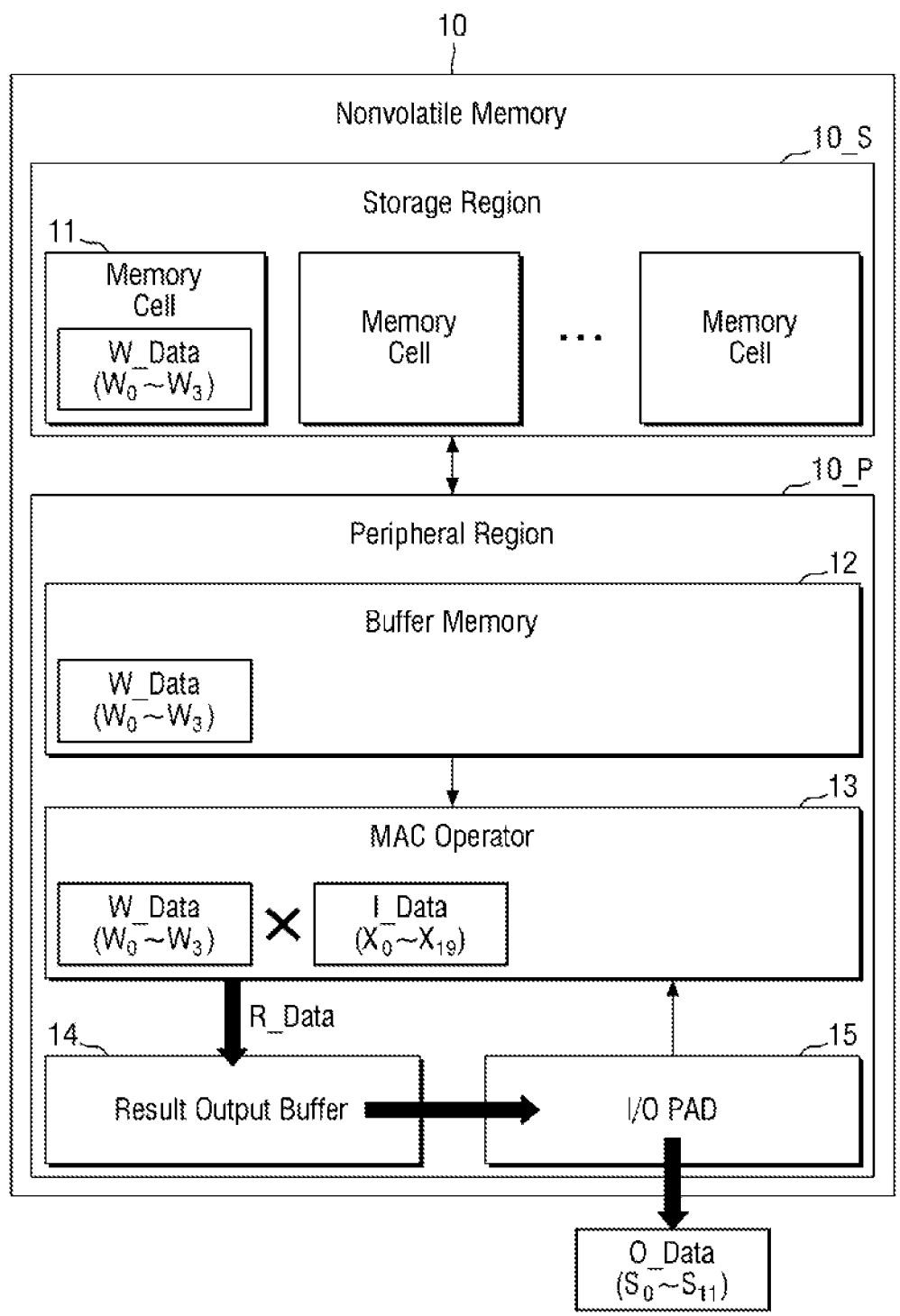
FIG. 7 is an exemplary diagram illustrating an operation in which an operation result of the MAC operator according to some embodiments is provided as output data.

FIG. 5 is an exemplary diagram illustrating an operation in which weight data is provided to a buffer memory from a memory cell according to some embodiments. FIG. 6 is an exemplary diagram explaining an operation in which input data and weight data are provided to a MAC operator according to some embodiments. FIG. 7 is an exemplary diagram illustrating an operation in which an operation result of the MAC operator according to some embodiments is provided as output data.

Referring to FIGS. 4 and 5, the weight data W_Data may be stored in at least a part of the plurality of memory cells 11. The weight data W_Data may include, for example, the first weight data $W_0$ to fourth weight data $W_3$. The memory controller 20 may provide the read command CMD of the weight data W_Data to the nonvolatile memory 10 to provide the weight data W_Data stored in the memory cell 11 to the buffer memory 12. In other words, according to a command of the memory controller 20, the weight data W_Data may be latched from the memory cell 11 to the buffer memory 12.

That is, in response to the MAC command (MAC CMD), first, the memory controller 20 may control the weight data W_Data to be read from the memory cell 11 to the buffer memory 12. When the weight data W_Data has been read to the buffer memory 12, the nonvolatile memory 10 may provide a read completion response to the memory controller 20.

Referring to FIGS. 4 and 6, the memory controller 20 may receive the read completion response. When the memory controller 20 receives the read completion response, the memory controller 20 may provide the input data I_Data to the nonvolatile memory 10. For example, the memory controller 20 may provide the input data I_Data to the I/O pad 15.

The MAC operator 13 may receive the input data I_Data via through I/O pad 15. For example, the MAC operator 13 may receive the first input data $X_0$ to twentieth input data $X_{19}$ through the I/O pad 15.

While the MAC operator 13 is provided with the input data I_Data, the weight data W_Data latched to the buffer memory 12 may also be provided to the MAC operator 13. For example, while the MAC operator 13 is provided with the first input data $X_0$ to twentieth input data $X_{19}$ through the I/O pad 15, the first weight data $W_0$ to fourth weight data $W_3$ latched to the buffer memory 12 may also be provided to the MAC operator 13.

According to some embodiments, after the weight data W_Data is read from the memory cell 11 into the buffer memory 12, the MAC operator 13 may receive the input data I_Data through the I/O pad 15. For example, before the MAC operator 13 receives the first input data $X_0$ to twentieth input data $X_{19}$, the first weight data $W_0$ to fourth weight data $W_3$ stored in the memory cell 11 may be read into the buffer memory 12.

Referring to FIGS. 4 and 7, the MAC operator 13 may receive the input data I_Data and the weight data W_Data and perform a convolution operation of the input data I_Data and the weight data W_Data (S120). The MAC operator 13 may provide the result output buffer 14 with a convolution operation result of the input data I_Data and the weight data W_Data. In other words, result data R_Data generated in the MAC operator 13 may be provided to the result output buffer 14. As described above, the result data R_Data may be intermediate result data of the convolution operation of the weight data W_Data and the input data I_Data. For example, the result data R_Data may be each of the first output data $S_0$ to the twelfth output data $S_{11}$. As another example, the result data R_Data may be each of a product $W_0X_0$ of the first weight data $W_0$ and the first input data $X_0$ to a product $W_3X_{19}$ of the fourth weight data $W_3$ and the twentieth input data $X_{19}$. According to some embodiments, the result data R_Data stored in the result output buffer 14 may be provided to the outside of the nonvolatile memory 10 as output data O_Data via the I/O pad 15.

Figure 8:
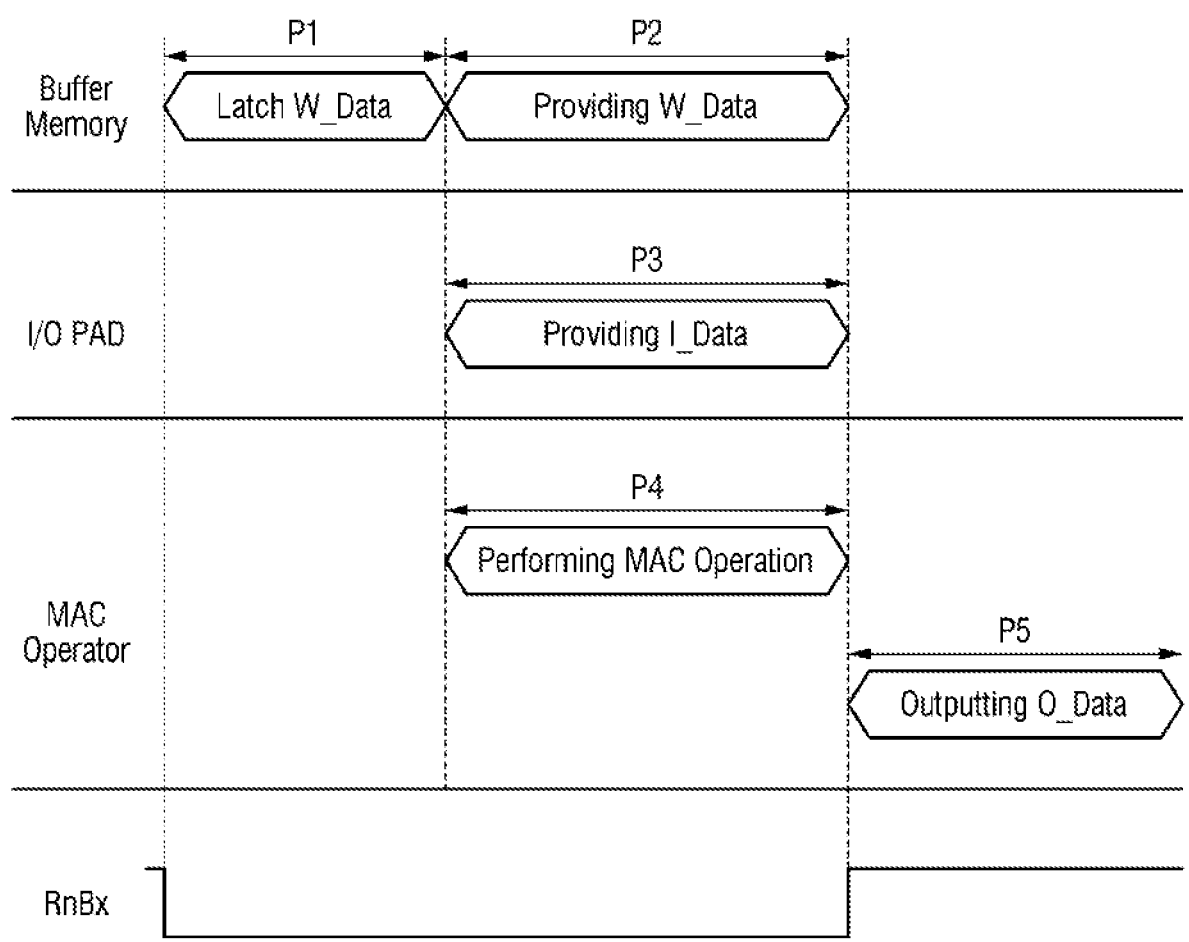
FIG. 8 is an exemplary diagram illustrating timings at which data are inputted/outputted according to some embodiments.

FIG. 8 is an exemplary diagram illustrating timings at which data are inputted/outputted according to some embodiments.

The timings at which data are inputted/outputted will be described with reference to FIGS. 5 to 8.

During a first period P1, the weight data W_Data may be latched to the buffer memory 12. That is, the weight data W_Data stored in the memory cell 11 of the nonvolatile memory 10 may be provided to the buffer memory 12 during the first period P1. In other words, the buffer memory 12 may receive and store the weight data W_Data from the memory cell 11 during the first period P1.

During a second period P2, the buffer memory 12 may provide the latched weight data W_Data to the MAC operator 13. In other words, the MAC operator 13 may receive the weight data W_Data from the buffer memory 12 during the second period P2.

During a third period P3, the I/O pad 15 may provide the input data I_Data to the MAC operator 13. In other words, the MAC operator 13 may receive the input data I_Data via the I/O pad 15 during the third period P3. According to some embodiments, the first period P1 may be earlier than the third period P3. In other words, the weight data W_Data may be read from the memory cell 11 to the buffer memory 12 before the MAC operator 13 receives the input data I_Data.

According to some embodiments, the second period P2 and the third period P3 may overlap each other. In other words, the MAC operator 13 may receive the weight data W_Data and the input data I_Data simultaneously. In this specification, the term "simultaneously" does not mean exactly the same time point. The term "simultaneously" means that two different events occur within the same period. In other words, the term "simultaneously" means that two events occur in parallel, not sequentially. For example, when the input data I_Data and the weight data W_Data are received within the same period, the input data I_Data and the weight data W_Data may be regarded as being received "simultaneously." As another example, when a MAC operation is performed in a period in which the input data I_Data is provided, the MAC operation may be regarded as being performed "simultaneously" when the input data I_Data is provided. The meaning of "simultaneously" as used herein can be clearly understood by those skilled in the art. A period in which the MAC operator 13 receives the input data I_Data and the weight data W_Data will be described in more detail with reference to FIG. 9.

Figure 9:
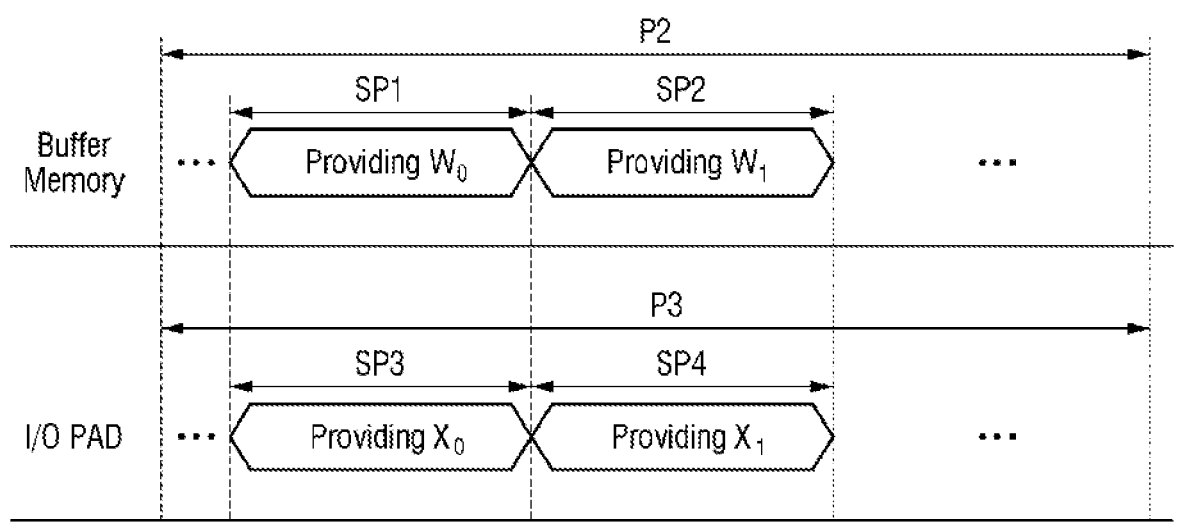
FIG. 9 is an exemplary diagram illustrating a period in which a MAC operator receives input data and weight data according to some embodiments.

FIG. 9 is an exemplary diagram illustrating a period in which a MAC operator receives input data and weight data according to some embodiments. For simplicity of description, a repeated or similar description will be briefly given or omitted.

Referring to FIGS. 8 and 9, during the second period P2, the MAC operator 13 may receive the weight data W_Data from the buffer memory 12. According to some embodiments, the second period P2 may include a first sub-period SP1 and a second sub-period SP2.

During the first sub-period SP1, the buffer memory 12 may provide the first weight data $W_0$ to the MAC operator 13. In other words, the MAC operator 13 may receive the first weight data $W_0$ from the buffer memory 12 during the first sub-period SP1.

During the second sub-period SP2, the buffer memory 12 may provide the second weight data $W_1$ to the MAC operator 13. In other words, the MAC operator 13 may receive the second weight data $W_1$ from the buffer memory 12 during the second sub-period SP2. According to some embodiments, the second sub-period SP2 may be arranged after the first sub-period SP1, but the embodiments are not limited thereto.

During the third period P3, the MAC operator 13 may receive the input data I_Data via the I/O pad 15. According to some embodiments, the third period P3 may include a third sub-period SP3 and a fourth sub-period SP4.

During the third period P3, the I/O pad 15 may provide the first input data $X_0$ to the MAC operator 13. In other words, the MAC operator 13 may receive the first input data $X_0$ through the I/O pad 15 during the third sub-period SP3.

During the fourth sub-period SP4, the I/O pad 15 may provide the second input data $X_1$ to the MAC operator 13. In other words, the MAC operator 13 may receive the second input data $X_1$ through the I/O pad 15 during the fourth sub-period SP4. According to some embodiments, the fourth sub-period SP4 may be arranged after the third sub-period SP3, but the embodiments are not limited thereto.

According to some embodiments, the first sub-period SP1 and the third sub-period SP3 may overlap each other. Further, the second sub-period SP2 and the fourth sub-period SP4 may overlap each other. In other words, according to some embodiments, the MAC operator 13 may receive the first weight data $W_0$ and the first input data $X_0$ simultaneously. Further, the MAC operator 13 may receive the second weight data $W_1$ and the second input data $X_1$ simultaneously.

Referring again to FIGS. 5 to 8, during a fourth period P4, the MAC operator 13 may perform a convolution operation of the input data I_Data and the weight data W_Data. According to some embodiments, the fourth period P4 and the second period P2 may overlap each other. Further, according to some embodiments, the fourth period P4 and the third period P3 may overlap each other. In other words, the MAC operator 13 may perform a convolution operation of the input data I_Data and the weight data W_Data simultaneously while receiving the input data I_Data and the weight data W_Data.

Although not shown, during the fourth period P4, the MAC operator 13 may provide an intermediate result of the convolution operation of the input data I_Data and the weight data W_Data to the result output buffer 14. In other words, during the fourth period P4, the result output buffer 14 may be provided with the result data R_Data.

During a fifth period P5, the result output buffer 14 may provide the output data O_Data to the outside of the nonvolatile memory 10 through the I/O pad 15. As described above, the output data O_Data may be, for example, the first output data $S_0$ to the twelfth output data $S_{11}$, or a product $W_0X_0$ of the first weight data $W_0$ and the first input data $X_0$ to a product $W_3X_{19}$ of the fourth weight data $W_3$ and the twentieth input data $X_{19}$.

According to some embodiments, the nonvolatile memory 10 may maintain a busy state from when the weight data W_Data is latched to the buffer memory 12 from the memory cell 11 until when the operation of the MAC operator 13 is terminated. In other words, while an internal operation of the nonvolatile memory 10 is performed, a busy state signal RnBx may be a logical low level (0).

According to some embodiments, a convolution operation of the input data I_Data and the weight data W_Data may be a combination of multiplication and summation operations. For example, referring to Eq. 1 as described above, the first output data $S_0$ may be the sum of a product of the first input data $X_0$ and the first weight data $W_0$, a product of the second input data $X_1$ and the second weight data $W_1$, a product of the sixth input data $X_5$ and the third weight data $W_2$ and a product of the seventh input data $X_6$ and the fourth weight data $W_3$. An effective multiplication operation of the input data I_Data and the weight data W_Data will be described with reference to FIGS. 10 to 12.

Figure 10:
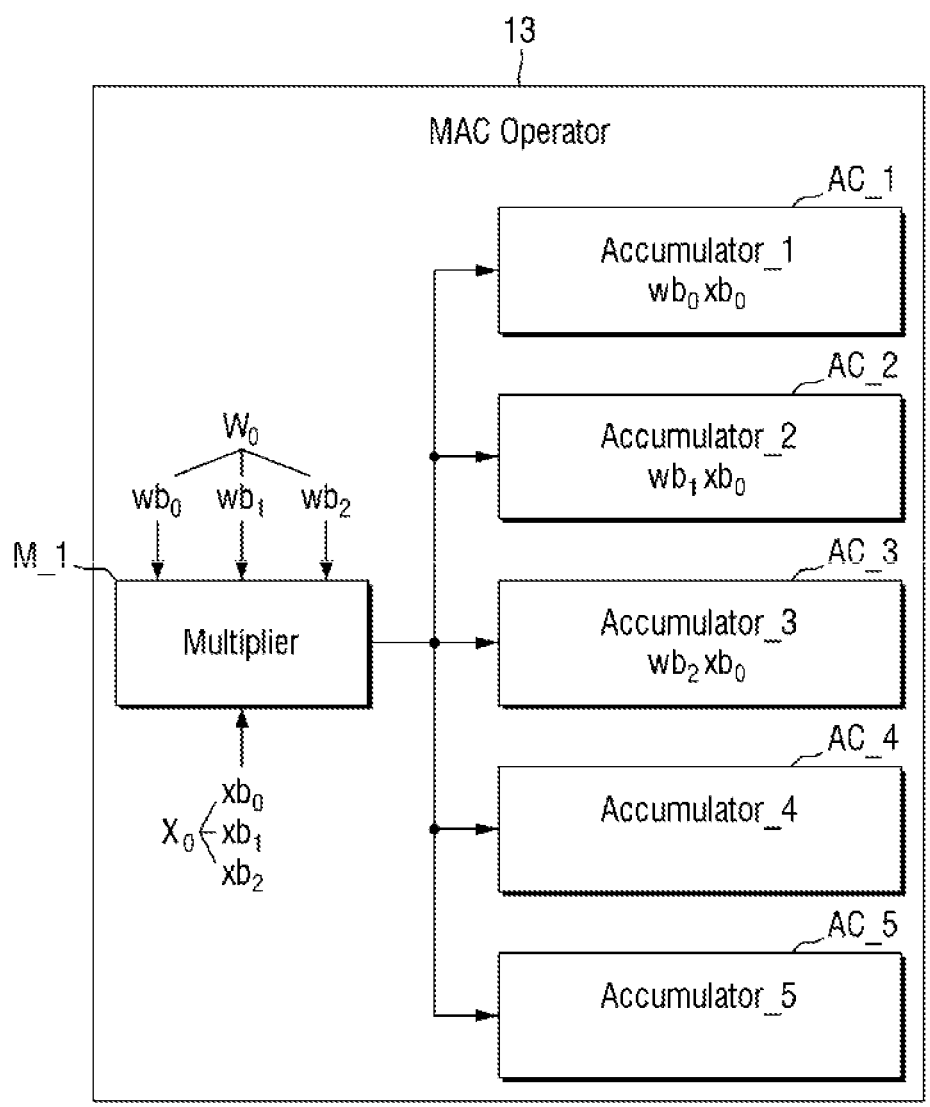
FIGS. 10 to 12 are exemplary diagrams illustrating a multiplication operation of input data and output data according to some embodiments.
Figure 11:
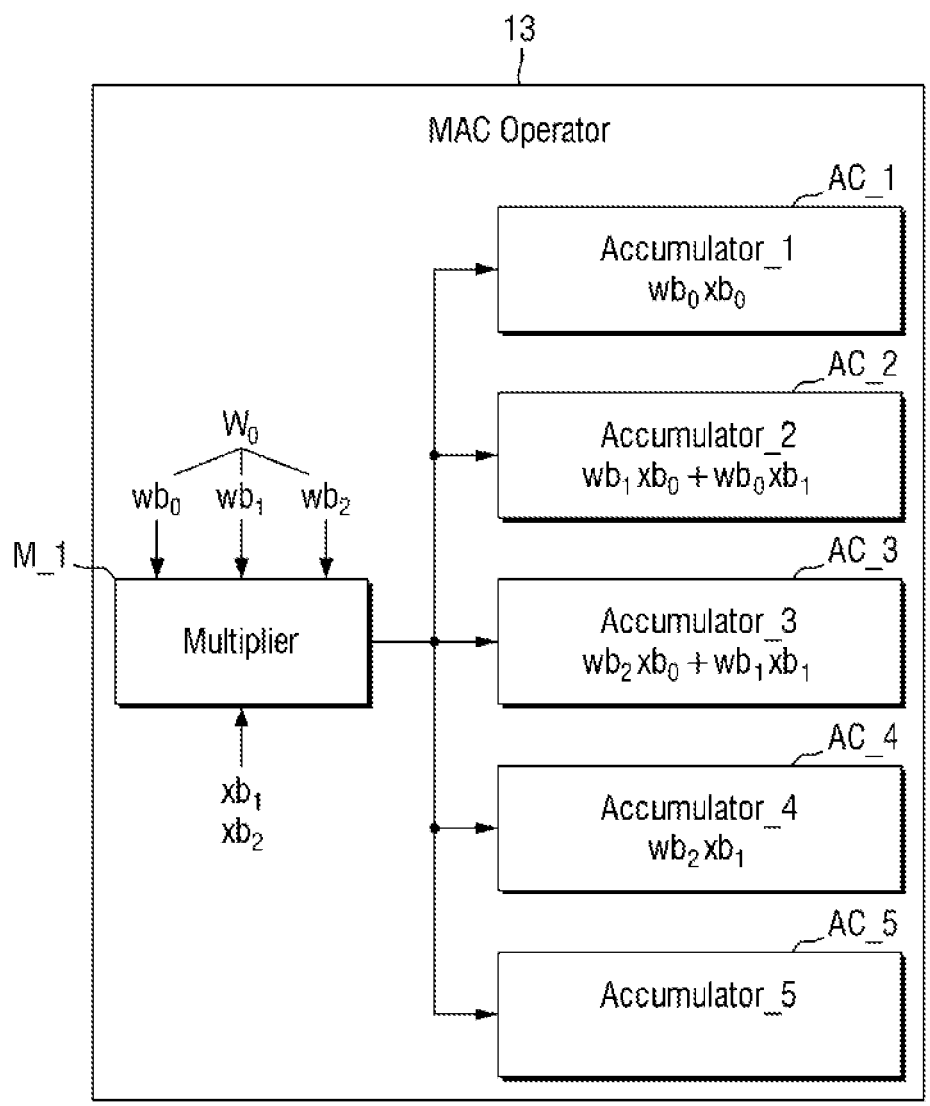
Figure 12:
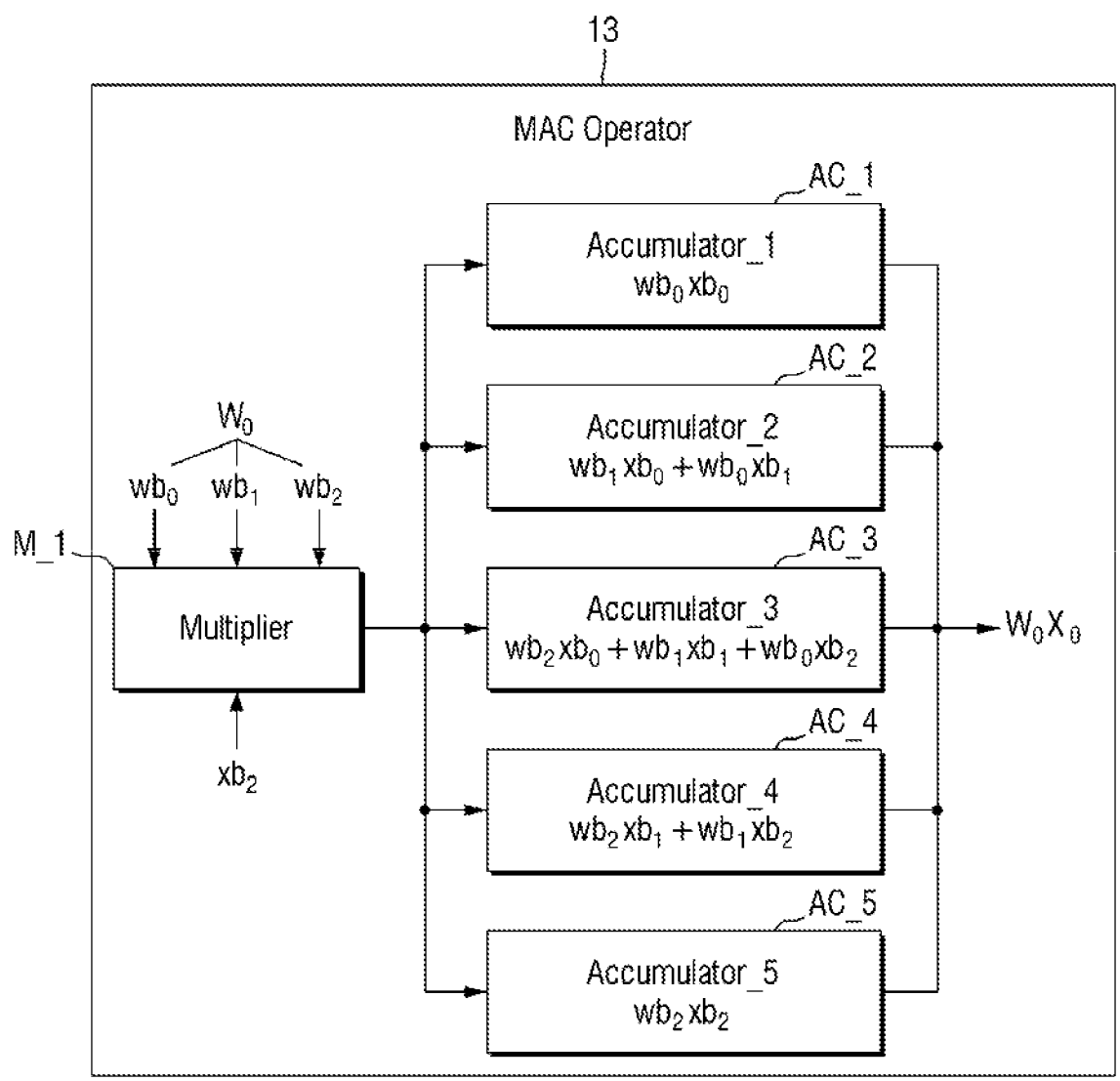

FIGS. 10 to 12 are exemplary diagrams illustrating a multiplication operation of input data and output data according to some embodiments. For simplicity of description, FIGS. 10 to 12 illustrate a multiplication operation of the first input data $X_0$ and the first weight data $W_0$ as an example, but the embodiments are not limited thereto. Further, for simplicity of description, it is assumed that the first input data $X_0$ is 3-bit data and the first weight data $W_0$ is also 3-bit data, but the embodiments are not limited thereto. In FIGS. 10 to 12, the first weight data $W_0$ is defined as data in which the most significant bit (MSB) is $wb_2$, the second bit is $wb_1$, and the least significant bit (LSB) is $wb_0$. Further, the first input data $X_0$ is defined as data in which the MSB is $xb_2$, the second bit is $xb_1$, and the LSB is $xb_0$.

Referring to FIGS. 9 to 12, the MAC operator 13 may include a first multiplier M_1, a first accumulator AC_1, a second accumulator AC_2, a third accumulator AC_3, a fourth accumulator AC_4 and a fifth accumulator AC_5.

The MAC operator 13 may receive the first weight data $W_0$ during the first sub-period SP1 and may receive the first input data $X_0$ during the third sub-period SP3. According to some embodiments, during the first sub-period SP1, all bits of the first weight data $W_0$ may be simultaneously provided and latched to the first multiplier M_1. In other words, the first weight data $W_0$ may be a multiplicand of the first multiplier M_1. For example, during the first sub-period SP1, $wb_2$, $wb_1$ and $wb_0$ may be simultaneously provided and latched to the first multiplier M_1. On the other hand, during the third sub-period SP3, the first input data $X_0$ may be sequentially provided to the first multiplier M_1. In other words, the first input data $X_0$ may be a multiplier of the first multiplier M_1. For example, during the third sub-period SP3, $xb_2$, $xb_1$ and $xb_0$ may be sequentially provided.

First, $xb_0$ may be provided to the first multiplier M_1. At this time, the first multiplier M_1 may calculate $wb_0xb_0$, $wb_1xb_0$ and $wb_2xb_0$. The operations of $wb_0xb_0$, $wb_1xb_0$ and $wb_2xb_0$ may be performed in parallel in the first multiplier M_1. The first multiplier M_1 may provide $wb_0xb_0$ to the first accumulator AC_1, $wb_1xb_0$ to the second accumulator AC_2, and $wb_2xb_0$ to the third accumulator AC_3.

Then, $xb_1$ may be provided to the first multiplier M_1. At this time, the first multiplier M_1 may calculate $wb_0xb_1$, $wb_1xb_1$ and $wb_2xb_1$. The operations of $wb_0xb_1$, $wb_1xb_1$ and $wb_2xb_1$ may be performed in parallel in the first multiplier M_1. The first multiplier M_1 may provide $wb_0xb_1$ to the second accumulator AC_2, $wb_1xb_1$ to the third accumulator AC_3, and $wb_2xb_1$ to the fourth accumulator AC_4.

Then, $xb_2$ may be provided to the first multiplier M_1. At this time, the first multiplier M_1 may calculate $wb_0xb_2$, $wb_1xb_2$ and $wb_2xb_2$. The operations of $wb_0xb_2$, $wb_1xb_2$ and $wb_2xb_2$ may be performed in parallel in the first multiplier M_1. The first multiplier M_1 may provide $wb_0xb_2$ to the third accumulator AC_3, $wb_1xb_2$ to the fourth accumulator AC_4, and $wb_2xb_2$ to the fifth accumulator AC_5.

According to some embodiments, each of the outputs of the first accumulator AC_1 to the fifth accumulator AC_5 may be a bit corresponding to each digit of the product $W_0X_0$ of the first weight data $W_0$ and the first input data $X_0$. According to some embodiments, the output of the first accumulator AC_1 may be the LSB of the product $W_0X_0$ of the first weight data $W_0$ and the first input data $X_0$, and the output of the fifth accumulator AC_5 may be the MSB of the product $W_0X_0$ of the first weight data $W_0$ and the first input data $X_0$. The MAC operator 13 according to some embodiments may perform a multiplication operation of the weight data W_Data and the input data I_Data in a simple and effective manner.

Although FIGS. 10 to 12 show the first multiplier M_1 as one component, the embodiments are not limited thereto. The embodiments of the present disclosure may be implemented using multiple multipliers, without undue experimentation, by those skilled in the art.

Figure 13:
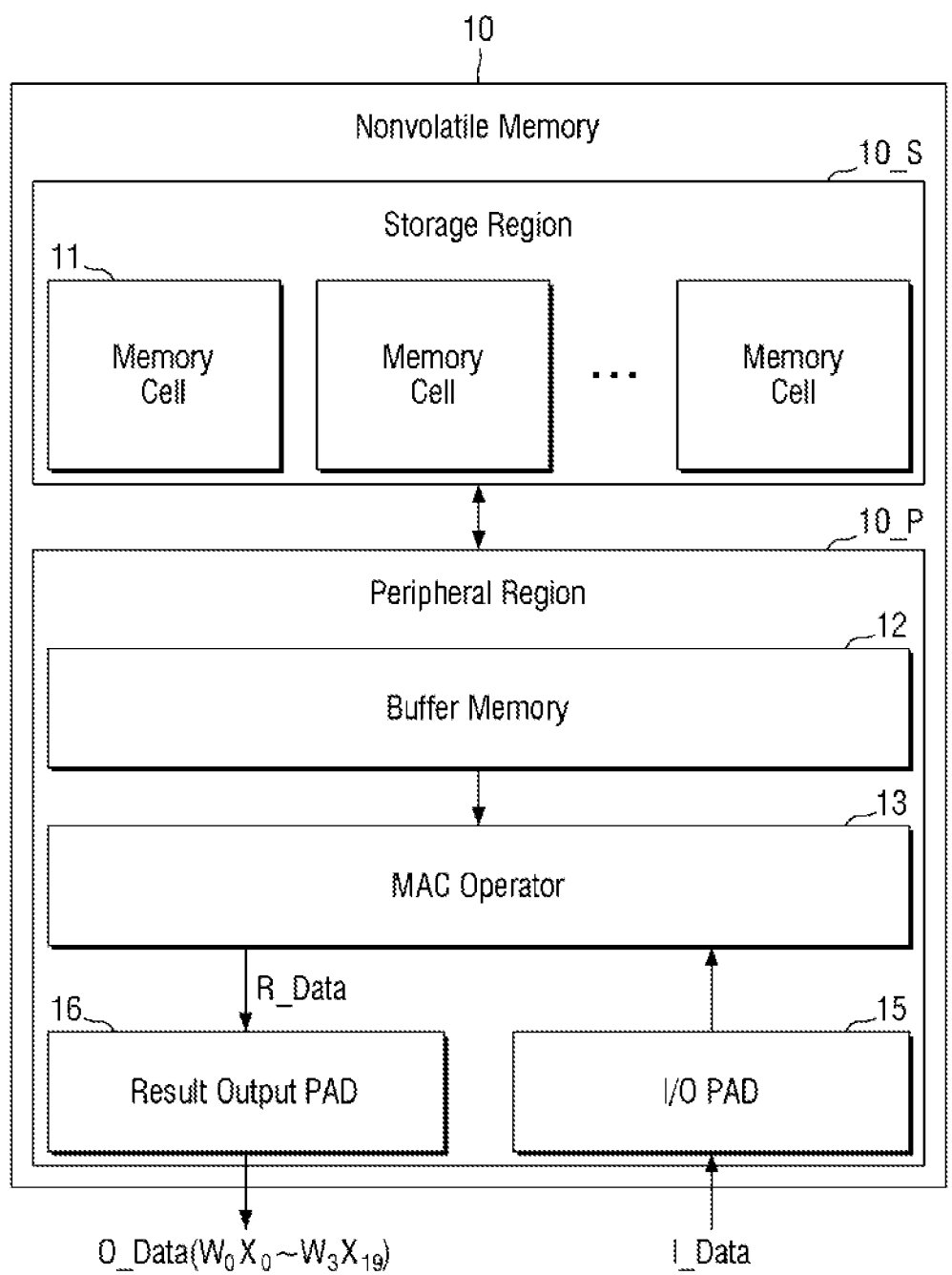
FIG. 13 is an exemplary block diagram illustrating a nonvolatile memory according to some embodiments.

FIG. 13 is an exemplary block diagram illustrating a nonvolatile memory according to some embodiments. For simplicity of description, a repeated or similar description will be briefly given or omitted.

Referring to FIG. 13, in the nonvolatile memory 10, the memory cells 11 may be disposed in the storage region 10_S. Further, the buffer memory 12, the MAC operator 13, a result output pad 16 and the I/O pad 15 may be disposed in the peripheral region 10_P of the nonvolatile memory 10. In other words, the nonvolatile memory 10 according to some embodiments may be the nonvolatile memory 10 described with reference to FIG. 3, which further includes the result output pad 16 instead of the result output buffer 14.

The MAC operator 13 may generate the result data R_Data by performing a convolution operation on the weight data W_Data and the input data I_Data. The result data R_Data generated in the MAC operator 13 may be provided to the result output pad 16. As described above, the result data R_Data may be intermediate result data of the convolution operation of the weight data W_Data and the input data I_Data. For example, the result data R_Data may be each of the first output data $S_0$ to the twelfth output data $S_{11}$. As another example, the result data R_Data may be each of a product $W_0X_0$ of the first weight data $W_0$ and the first input data $X_0$ to a product $W_3X_{19}$ of the fourth weight data $W_3$ and the twentieth input data $X_{19}$.

The result data R_Data provided to the result output pad 16 may be provided to the outside of the nonvolatile memory 10 as output data O_Data. According to some embodiments, the output data O_Data may be the same data as the result data R_Data.

According to some embodiments, the result output pad 16 may be configured separately from the I/O pad 15 provided with the input data I_Data. Thus, while the input data I_Data is provided to the MAC operator 13 via the I/O pad 15, the output data O_Data may be provided to the outside of the nonvolatile memory 10 through the result output pad 16. An exemplary description will be given with reference to FIG. 14.

Figure 14:
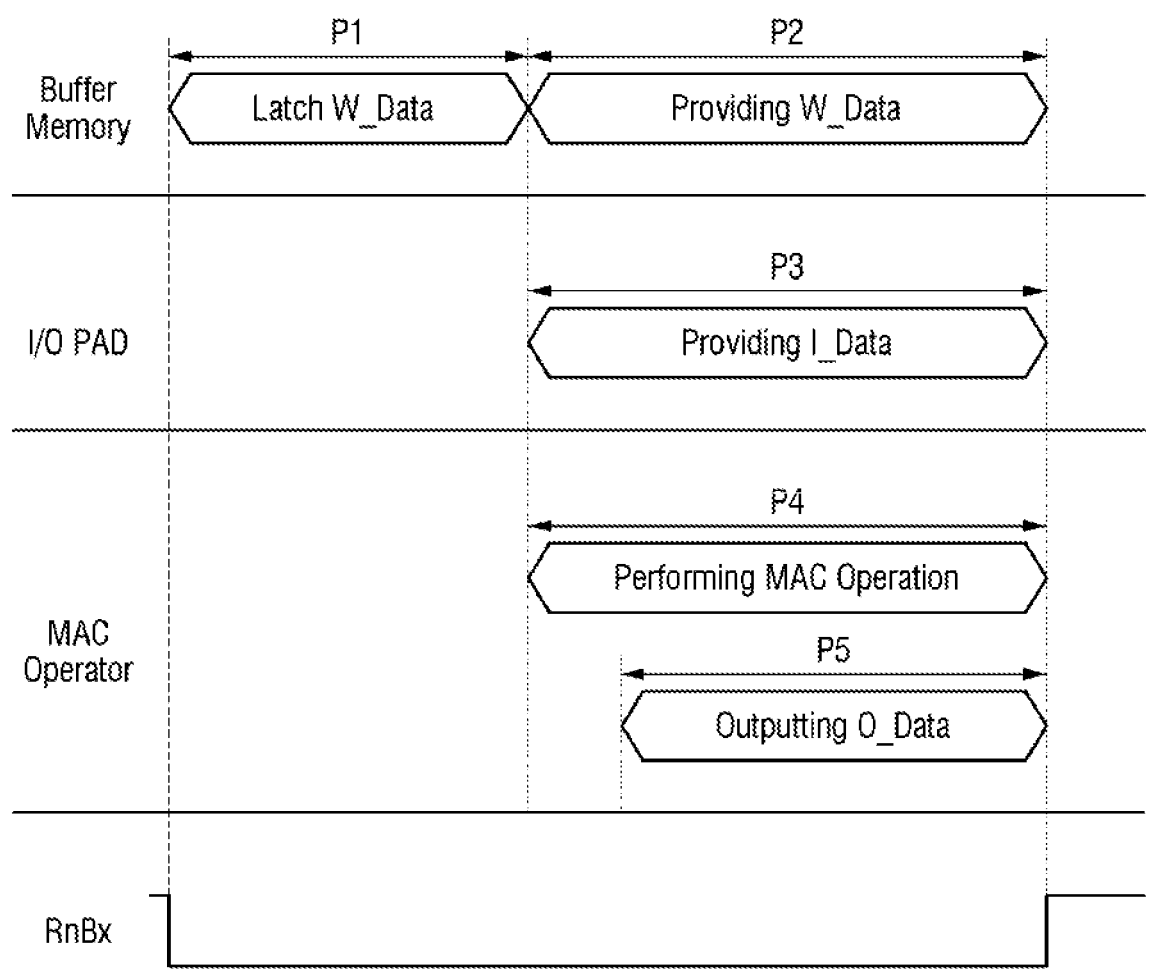
FIG. 14 is an exemplary diagram illustrating timings at which data are inputted/outputted according to some embodiments.

FIG. 14 is an exemplary diagram illustrating timings at which data are inputted/outputted according to some embodiments. For simplicity of description, a repeated or similar description will be briefly given or omitted.

Referring to FIGS. 13 and 14, during a first period P1, the buffer memory 12 may latch the weight data W_Data. That is, the weight data W_Data stored in the memory cell 11 of the nonvolatile memory 10 may be provided to the buffer memory 12 during the first period P1.

During a second period P2, the buffer memory 12 may provide the latched weight data W_Data to the MAC operator 13.

During a third period P3, the I/O pad 15 may provide the input data I_Data to the MAC operator 13. According to some embodiments, the second period P2 and the third period P3 may overlap each other. In other words, the MAC operator 13 may receive the weight data W_Data and the input data I_Data simultaneously. According to some embodiments, the first period P1 may be earlier than the third period P3.

During a fourth period P4, the MAC operator 13 may perform a convolution operation of the input data I_Data and the weight data W_Data. According to some embodiments, the fourth period P4 and the second period P2 may overlap each other. Further, according to some embodiments, the fourth period P4 and the third period P3 may overlap each other. In other words, the MAC operator 13 may perform a convolution operation of the input data I_Data and the weight data W_Data simultaneously while receiving the input data I_Data and the weight data W_Data.

During a fifth period P5, the MAC operator 13 may provide the result data R_Data to the result output pad 16. The result output pad 16, which has received the result data R_Data, may provide it to the outside of the nonvolatile memory 10 as output data O_Data. According to some embodiments, the fifth period P5 may at least partially overlap with the second period P2. Further, the fifth period P5 may at least partially overlap with the third period P3. Furthermore, the fifth period P5 may at least partially overlap with the fourth period P4. In other words, the MAC operator 13 may provide the output data O_Data to the outside of the nonvolatile memory 10 through the result output pad 16 simultaneously while receiving the input data I_Data through the I/O pad 15 in at least a partial period. For example, the output data O_Data may be each of the first output data $S_0$ to the twelfth output data $S_{11}$, or each of a product $W_0X_0$ of the first weight data $W_0$ and the first input data $X_0$ to a product $W_3X_{19}$ of the fourth weight data $W_3$ and the twentieth input data $X_{19}$.

Figure 15:
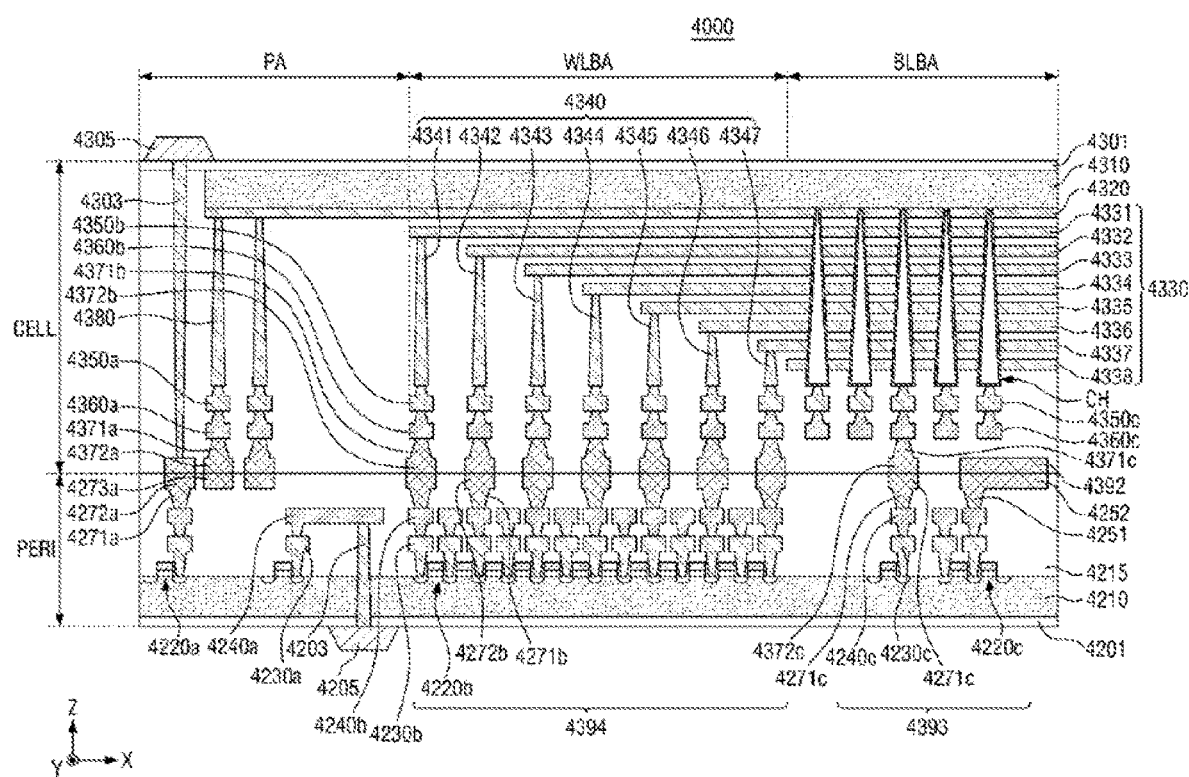
FIG. 15 is a sectional view of a nonvolatile memory according to some embodiments.

FIG. 15 is a sectional view of a nonvolatile memory according to some embodiments.

Referring to FIG. 15, a nonvolatile memory 4000 may have a chip-to-chip (C2C) structure. The C2C structure may refer to a structure formed by manufacturing an upper chip including a cell region CELL on a first wafer, manufacturing a lower chip including a peripheral region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral region PERI and the cell region CELL of the nonvolatile memory 4000 may include an external pad bonding area PA, a word line bonding area WLBA, and a bit line bonding area BLBA.

The peripheral region PERI may include a first substrate 4210, an interlayer insulating layer 4215, a plurality of circuit elements 4220a, 4220b, and 4220c formed on the first substrate 4210, first metal layers 4230a, 4230b, and 4230c respectively connected to the plurality of circuit elements 4220a, 4220b, and 4220c, and second metal layers 4240a, 4240b, and 4240c formed on the first metal layers 4230a, 4230b, and 4230c. In an example embodiment, the first metal layers 4230a, 4230b, and 4230c may be formed of tungsten having relatively high resistance, and the second metal layers 4240a, 4240b, and 4240c may be formed of copper having relatively low resistance.

In an example embodiment illustrate in FIG. 15, although the first metal layers 4230a, 4230b, and 4230c and the second metal layers 4240a, 4240b, and 4240c are shown and described, they are not limited thereto, and one or more metal layers may be further formed on the second metal layers 4240a, 4240b, and 4240c. At least a portion of the one or more metal layers formed on the second metal layers 4240a, 4240b, and 4240c may be formed of aluminum or the like having a lower resistance than those of copper forming the second metal layers 4240a, 4240b, and 4240c.

The interlayer insulating layer 4215 may be disposed on the first substrate 4210 and cover the plurality of circuit elements 4220a, 4220b, and 4220c, the first metal layers 4230a, 4230b, and 4230c, and the second metal layers 4240a, 4240b, and 4240c. The interlayer insulating layer 4215 may include an insulating material such as silicon oxide, silicon nitride, or the like.

Lower bonding metals 4271b and 4272b may be formed on the second metal layer 4240b in the word line bonding area WLBA. In the word line bonding area WLBA, the lower bonding metals 4271b and 4272b in the peripheral region PERI may be electrically connected to upper bonding metals 4371b and 4372b in the cell region CELL in a bonding manner, and the lower bonding metals 4271b and 4272b and the upper bonding metals 4371b and 4372b may be formed of aluminum, copper, tungsten, or the like.

The cell region CELL may include at least one memory block. The cell region CELL may include a second substrate 4310 and a common source line 4320. On the second substrate 4310, a plurality of word lines 4331 to 4338 (i.e., 4330) may be stacked in a direction (a Z-axis direction), perpendicular to an upper surface of the second substrate 4310. At least one string select line and at least one ground select line may be arranged on and below the plurality of word lines 4330, respectively, and the plurality of word lines 4330 may be disposed between the at least one string select line and the at least one ground select line.

In the bit line bonding area BLBA, a channel structure CH may extend in a direction, perpendicular to the upper surface of the second substrate 4310, and pass through the plurality of word lines 4330, the at least one string select line, and the at least one ground select line. The channel structure CH may include a data storage layer, a channel layer, a buried insulating layer, and the like, and the channel layer may be electrically connected to a first metal layer 4350c and a second metal layer 4360c. For example, the first metal layer 4350c may be a bit line contact, and the second metal layer 4360c may be a bit line. In an example embodiment, the bit line 4360c may extend in a first direction (a Y-axis direction), parallel to the upper surface of the second substrate 4310.

In an example embodiment illustrated in FIG. 15, an area in which the channel structure CH, the bit line 4360c, and the like are disposed may be defined as the bit line bonding area BLBA. In the bit line bonding area BLBA, the bit line 4360c may be electrically connected to the circuit elements 4220c providing a page buffer 4393 in the peripheral region PERI. For example, the bit line 4360c may be connected to upper bonding metals 4371c and 4372c in the cell region CELL, and the upper bonding metals 4371c and 4372c may be connected to lower bonding metals 4271c and 4272c connected to the circuit elements 4220c of the page buffer 4393.

In the word line bonding area WLBA, the plurality of word lines 4330 may extend in a second direction (an X-axis direction), parallel to the upper surface of the second substrate 4310, and may be connected to a plurality of cell contact plugs 4341 to 4347 (i.e., 4340). The plurality of word lines 4330 and the plurality of cell contact plugs 4340 may be connected to each other in pads provided by at least a portion of the plurality of word lines 4330 extending in different lengths in the second direction. A first metal layer 4350b and a second metal layer 4360b may be connected to an upper portion of the plurality of cell contact plugs 4340 connected to the plurality of word lines 4330, sequentially. The plurality of cell contact plugs 4340 may be connected to the circuit region PERI by the upper bonding metals 4371b and 4372b of the cell region CELL and the lower bonding metals 4271b and 4272b of the peripheral region PERI in the word line bonding area WLBA.

The plurality of cell contact plugs 4340 may be electrically connected to the circuit elements 4220b providing a row decoder 4394 in the peripheral region PERI. In an example embodiment, operating voltages of the circuit elements 4220b providing the row decoder 4394 may be different than operating voltages of the circuit elements 4220c providing the page buffer 4393. For example, operating voltages of the circuit elements 4220c providing the page buffer 4393 may be greater than operating voltages of the circuit elements 4220b providing the row decoder 4394.

A common source line contact plug 4380 may be disposed in the external pad bonding area PA. The common source line contact plug 4380 may be formed of a conductive material such as a metal, a metal compound, polysilicon, or the like, and may be electrically connected to the common source line 4320. A first metal layer 4350a and a second metal layer 4360a may be stacked on an upper portion of the common source line contact plug 4380, sequentially. For example, an area in which the common source line contact plug 4380, the first metal layer 4350a, and the second metal layer 4360a are disposed may be defined as the external pad bonding area PA.

Input-output pads 4205 and 4305 may be disposed in the external pad bonding area PA. Referring to FIG. 15, a lower insulating film 4201 covering a lower surface of the first substrate 4210 may be formed below the first substrate 4210, and a first input-output pad 4205 may be formed on the lower insulating film 4201. The first input-output pad 4205 may be connected to at least one of the plurality of circuit elements 4220a, 4220b, and 4220c disposed in the peripheral region PERI through a first input-output contact plug 4203, and may be separated from the first substrate 4210 by the lower insulating film 4201. In addition, a side insulating film may be disposed between the first input-output contact plug 4203 and the first substrate 4210 to electrically separate the first input-output contact plug 4203 and the first substrate 4210.

Referring to FIG. 15, an upper insulating film 4301 covering the upper surface of the second substrate 4310 may be formed on the second substrate 4310, and a second input-output pad 4305 may be disposed on the upper insulating layer 4301. The second input-output pad 4305 may be connected to at least one of the plurality of circuit elements 4220a, 4220b, and 4220c disposed in the peripheral region PERI through a second input-output contact plug 4303.

According to embodiments, the second substrate 4310 and the common source line 4320 may not be disposed in an area in which the second input-output contact plug 4303 is disposed. Also, the second input-output pad 4305 may not overlap the word lines 4330 in the third direction (the Z-axis direction). Referring to FIG. 15, the second input-output contact plug 4303 may be separated from the second substrate 4310 in a direction, parallel to the upper surface of the second substrate 4310, and may pass through the interlayer insulating layer 4315 of the cell region CELL to be connected to the second input-output pad 4305.

According to embodiments, the first input-output pad 4205 and the second input-output pad 4305 may be selectively formed. For example, the nonvolatile memory 4000 may include only the first input-output pad 4205 disposed on the first substrate 4210 or the second input-output pad 4305 disposed on the second substrate 4310. Alternatively, the nonvolatile memory 4000 may include both the first input-output pad 4205 and the second input-output pad 4305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral region PERI.

In the external pad bonding area PA, the nonvolatile memory 4000 may include a lower metal pattern 4273a, corresponding to an upper metal pattern 4372a formed in an uppermost metal layer of the cell region CELL, and having the same shape as the upper metal pattern 4372a of the cell region CELL, in an uppermost metal layer of the peripheral region PERI. In the peripheral region PERI, the lower metal pattern 4273a formed in the uppermost metal layer of the peripheral region PERI may not be connected to a contact. Similarly, in the external pad bonding area PA, an upper metal pattern, corresponding to the lower metal pattern formed in an uppermost metal layer of the peripheral region PERI, and having the same shape as a lower metal pattern of the peripheral region PERI, may be formed in an uppermost metal layer of the cell region CELL.

The lower bonding metals 4271b and 4272b may be formed on the second metal layer 4240b in the word line bonding area WLBA. In the word line bonding area WLBA, the lower bonding metals 4271b and 4272b of the peripheral region PERI may be electrically connected to the upper bonding metals 4371b and 4372b of the cell region CELL by a Cu—Cu bonding.

Further, the bit line bonding area BLBA, an upper metal pattern 4392, corresponding to a lower metal pattern 4252 formed in the uppermost metal layer of the peripheral region PERI, and having the same shape as the lower metal pattern 4252 of the peripheral region PERI, may be formed in an uppermost metal layer of the cell region CELL. A contact may not be formed on the upper metal pattern 4392 formed in the uppermost metal layer of the cell region CELL.

In an example embodiment, corresponding to a metal pattern formed in an uppermost metal layer in one of the cell region CELL and the peripheral region PERI, a reinforcement metal pattern having the same shape as the metal pattern may be formed in an uppermost metal layer in another one of the cell region CELL and the peripheral region PERI, and a contact may not be formed on the reinforcement metal pattern.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A memory device comprising:
   an upper chip formed on a first wafer, the upper chip including a cell region including a first metal pad;
   a memory cell in the cell region configured to store weight data;
   a lower chip formed on a second wafer different from the first wafer, the lower chip including a peripheral region including a second metal pad and vertically connected to the memory cell by the first metal pad and the second metal pad;
   a buffer memory in the peripheral region configured to read the weight data from the memory cell;
   an input/output pad in the peripheral region configured to receive input data; and
   a multiply-accumulate (MAC) operator in the peripheral region configured to receive the weight data from the buffer memory and receive the input data from the input/output pad to perform a convolution operation of the weight data and the input data,
   wherein the input data is provided to the MAC operator during a first period,
   wherein the MAC operator performs the convolution operation of the weight data and the input data during a second period overlapping with the first period,
   wherein the first metal pad is connected to the second metal pad at a point that overlaps the memory cell in a planar view, and
   wherein the upper chip is connected with the lower chip by connecting the first metal pad with the second metal pad.

2. The memory device of claim 1, wherein the weight data is provided to the MAC operator during a third period overlapping with the first period.

3. The memory device of claim 1, wherein before the input data is provided to the MAC operator, the buffer memory reads the weight data from the memory cell.

4. The memory device of claim 1, wherein the input data includes first and second input data,
   wherein the weight data includes first and second weight data,
   wherein the first and second input data are provided to the MAC operator during first and second sub-periods, respectively,
   wherein the first and second weight data are provided to the MAC operator during third and fourth sub-periods, respectively, and
   wherein the first sub-period overlaps with the third sub-period, and the second sub-period overlaps with the fourth sub-period.

5. The memory device of claim 1, wherein the weight data includes first and second weight bits,
   wherein the input data includes first and second input bits,
   wherein the MAC operator includes a first multiplier and first to third accumulators,
   wherein performing the convolution operation by the MAC operator comprises performing a multiplication operation of the weight data and the input data by the first multiplier, and wherein performing the multiplication operation by the first multiplier comprises, by the first multiplier, calculating a first product of the first weight bit and the first input bit and providing the first product to the first accumulator, calculating a second product of the second weight bit and the first input bit and providing the second product to the second accumulator, calculating a third product of the first weight bit and the second input bit and providing the third product to the second accumulator, and calculating a fourth product of the second weight bit and the second input bit and providing the fourth product to the third accumulator.

6. The memory device of claim 5, wherein an output of the first accumulator is a least significant bit (LSB) of a product of the weight data and the input data.

7. The memory device of claim 5, wherein the second accumulator outputs a sum of the second product and the third product.

8. The memory device of claim 1, further comprising a result output buffer configured to store a convolution operation result of the weight data and the input data.

9. The memory device of claim 8, wherein the convolution operation result stored in the result output buffer is outputted through the input/output pad.

10. The memory device of claim 1, further comprising a result output pad which outputs a convolution operation result of the weight data and the input data and is different from the input/output pad.

11. The memory device of claim 10, wherein the MAC operator provides the convolution operation result to the result output pad during a fourth period overlapping with the second period.

12. A memory device comprising:
an upper chip formed on a first wafer, the upper chip including a cell region including a first metal pad and a memory cell;
a lower chip formed on a second wafer different from the first wafer, the lower chip including a peripheral region including a second metal pad;
a buffer memory in the peripheral region configured to store weight data including first and second weight bits;
an input/output pad in the peripheral region configured to receive input data including first and second input bits; and
a MAC operator in the peripheral region including first to third accumulators and configured to receive the weight data and the input data and perform a convolution operation of the weight data and the input data,
wherein the first metal pad is connected to the second metal pad at a point that overlaps the memory cell in a planar view,
wherein the upper chip is connected with the lower chip by connecting the first metal pad with the second metal pad, and
wherein performing the convolution operation of the weight data and the input data by the MAC operator comprises,
calculating a first product of the first weight bit and the first input bit and providing the first product to the first accumulator,
calculating a second product of the second weight bit and the first input bit and providing the second product to the second accumulator, calculating a third product of the first weight bit and the second input bit and providing the third product to the second accumulator, and calculating a fourth product of the second weight bit and the second input bit and providing the fourth product to the third accumulator.

13. The memory device of claim 12, wherein the first product and the second product are performed in parallel, and
wherein the third product and the fourth product are performed in parallel.

14. The memory device of claim 12, wherein performing the convolution operation by the MAC operator comprises performing a multiplication operation of the weight data and the input data by the MAC operator, and
wherein an output of the first accumulator is a least significant bit (LSB) of the multiplication operation.

15. The memory device of claim 12, wherein the input data is provided to the MAC operator during a first period, and
wherein the MAC operator performs the convolution operation during a second period overlapping with the first period.

16. The memory device of claim 12, wherein the input data is provided to the MAC operator during a first period, and
wherein the weight data is provided to the MAC operator during a third period overlapping with the first period.

17. The memory device of claim 12, further comprising the memory cell configured to store the weight data,
wherein the weight data is read from the memory cell and stored in the buffer memory.

18. The memory device of claim 17, wherein before the MAC operator receives the input data, the weight data is read from the memory cell to the buffer memory.

19. The memory device of claim 12, further comprising a result output pad which outputs a convolution operation result of the weight data and the input data and is different from the input/output pad.

20. A memory device comprising:
an upper chip formed on a first wafer, the upper chip including a cell region including a first metal pad;
a memory cell in the cell region configured to store weight data;
a lower chip formed on a second wafer different from the first wafer, the lower chip including a peripheral region including a second metal pad;
a buffer memory in the peripheral region configured to read the weight data from the memory cell;
an input/output pad in the peripheral region configured to receive input data; and
a MAC operator in the peripheral region configured to perform a convolution operation of the weight data and the input data,
wherein the first metal pad is connected to the second metal pad at a point that overlaps the memory cell in a planar view,
wherein the upper chip is connected with the lower chip by connecting the first metal pad with the second metal pad,
wherein the buffer memory reads the weight data from the memory cell before the input data is provided to the input/output pad,
wherein the input data is provided to the MAC operator from the input/output pad during a first period, and wherein the weight data is provided to the MAC operator from the buffer memory during a second period overlapping with the first period.

* * * * *